(12) United States Patent
Williams (10) Patent No.: US 11,574,788 B1
(45) Date of Patent: Feb. 7, 2023

(54) ION SOURCE HAVING A MAGNETIC FIELD TRANSLATABLE ALONG AN AXIS OF THE SOURCE

(71) Applicant: Adelphi Technology, Inc., Redwood City, CA (US)

(72) Inventor: David Lowndes Williams, Los Altos, CA (US)

(73) Assignee: Adelphi Technology, Inc., Redwood City, CA (US)

( * ) Notice: Subject to any disclaimer, the term of this patent is extended or adjusted under 35 U.S.C. 154(b) by 0 days.

(21) Appl. No.: 17/497,013

(22) Filed: Oct. 8, 2021

(51) Int. Cl.
*H01J 27/02* (2006.01)
*H01J 27/16* (2006.01)

(52) U.S. Cl.
CPC ............ *H01J 27/022* (2013.01); *H01J 27/16* (2013.01)

(58) Field of Classification Search
CPC ................................ H01J 27/022; H01J 27/16
See application file for complete search history.

(56) References Cited

U.S. PATENT DOCUMENTS

2011/0044418 A1\* 2/2011 Stubbers .................. G21B 1/19
376/121

\* cited by examiner

*Primary Examiner* — Joseph L Williams
(74) *Attorney, Agent, or Firm* — Donald R. Boys; Central Coast Patent Agency LLC (57) ABSTRACT

An ion source has a vacuum envelope structure having a cylindrical portion with a lengthwise axis and an inside diameter defining an interior volume, joined at one end to a flange concentric with the axis, the cylindrical portion open by an exit aperture through the flange and open at an end opposite the flange, an RF feedthrough closing the open end of the cylindrical portion opposite the flange, creating a cylindrical interior volume open only through the exit aperture, and a magnet system carrier structure surrounding the cylindrical portion of the vacuum envelope and carrying at least one annular permanent magnet concentric with the lengthwise axis, providing a magnetic field penetrating the interior volume. The ion source is characterized in that the magnet system carrier structure is translatable along the lengthwise axis enabling variable positioning of the magnetic field in the interior volume along the lengthwise axis.

20 Claims, 8 Drawing Sheets

ION SOURCE HAVING A MAGNETIC FIELD TRANSLATABLE ALONG AN AXIS OF THE SOURCE

BACKGROUND OF THE INVENTION

1. Field of the Invention

The present invention is in the technical field of generating ions for sustaining an ion beam.

2. Description of Related Art

Apparatus for generating ions for various processes are well-known in the art. Electron Cyclotron Resonance (ECR) ion sources have been available for some time. Relatively recently miniature ECR ion sources have been developed for such as etching and lithography applications and a range of miniature ion sources have been developed for space-borne ion thruster applications. ECR ion sources for compact neutron generators have also been reported, and the current state of the art for such ECR ion sources miniaturization is currently a plasma volume of I.D. of about 30 mm Dia,×40 mm length, which equates to a plasma volume of approximately 56,500 $mm^3$. ECR ion sources in conventional art may be powered through microwave window coupling or through direct antenna coupling.

Direct antenna coupling was proposed and simulated by Becker in a presentation at a Production and Neutralization of Negative Ions and Beams (PNNIB) conference in Santa Fe, NM in 2006 (11th International Symposium on the Production and Neutralization of Negative Ions and Beams) and was subsequently published in 2007. In this presentation the ion source with axial RF coupling had dimensions I.D. 47 mm×134 mm length, resulting in an ion source volume of about 450,000 $mm^3$. ECR ion sources with axial RF connection have been commercially available since 2013, such as the monogan® M-100 source from Pantechnik. The Pantechnik device however is still relatively large (132 mm in length) and based on sales literature may be based on a helicon discharge surface plasma source.

ECR ion sources can produce a high atomic fraction of species. ECR ion sources can also be large and may require significant cooling. Accordingly, there is a need for a miniature, low power ion source capable of producing a high atomic fraction of species, as well as a need, especially for portable and battery-operated applications.

BRIEF SUMMARY OF THE INVENTION

In one embodiment of the invention an ion source is provided, comprising a vacuum envelope structure comprising a cylindrical portion with a lengthwise axis and an inside diameter defining an interior volume, joined at one end to a flange concentric with the axis, the cylindrical portion open by an exit aperture through the flange and open at an end opposite the flange, an RF feedthrough closing the open end of the cylindrical portion opposite the flange, creating a cylindrical interior volume open only through the exit aperture, and a magnet system carrier structure surrounding the cylindrical portion of the vacuum envelope and carrying at least one annular permanent magnet concentric with the lengthwise axis, providing a magnetic field penetrating the interior volume. The ion source is characterized in that the magnet system carrier structure is translatable along the lengthwise axis enabling variable positioning of the magnetic field in the interior volume along the lengthwise axis.

In one embodiment the structure of the magnet system is implemented to provide a magnetic intensity at the axis, adjacent the exit aperture within the volume of the vacuum envelope, of a strength to provide electron cyclotron resonance (ECR) with frequency of power provided at the RF feedthrough. Also, in one embodiment the cylindrical portion of the vacuum envelope is open through the flange at the inside diameter, further comprising an iris structure having a front face joined to a cylindrical portion with an inside diameter, and an outside diameter sized to fit within the inside diameter of the cylindrical portion of the vacuum envelope, the iris structure providing the exit aperture through the front face, the iris structure inserted into the cylindrical portion of the vacuum envelope such that the front face of the iris structure is proximate the flange. In one embodiment the ion source further female threading on the inside diameter of the of the cylindrical portion of the vacuum envelope and male threading on the outside diameter of the cylindrical portion of the iris structure, such that the iris structure is threaded into the vacuum envelope until a back part of the front face of the iris structure is proximate the flange. And in one embodiment a front part of the front face of the iris structure presents a convex conical shape concentric with the lengthwise axis.

In one embodiment the magnet system carrier structure has a first portion fastened to the flange of the vacuum envelope with internal threading in the direction of the axis, and a second portion that carries the at least one annular permanent magnet, the second portion having external threading, such that engaging the threads and turning the second portion relative to the first portion provides the translation of the second portion and the magnetic field along the axis. Also, in one embodiment the magnet system carrier structure carries a stack of one or more annular permanent magnets and spacers. Also, in one embodiment the spacers are one of magnetically permeable material or non-magnetic material. In one embodiment the magnet system carrier structure is made from a non-magnetic material. And in one embodiment the carrier structure is made from a polymer material.

In one embodiment the ion source further comprises an annular magnetically permeable disk surrounding the cylindrical portion of the vacuum envelope adjacent the flange, the magnetically permeable disk shaping the magnetic field such that magnetic field strength beyond the flange away from the ion source is kept substantially below the ECR field strength. Also, in one embodiment the material of the vacuum envelope is stainless steel. Also, in one embodiment the flange conforms to dimensions and characteristics of a Conflat™ DN35CF of 2.75 inches outside diameter, such that the overall diameter of the ion source is 2.75 inches. In one embodiment the ion source further comprises a hand wheel joined to the second part of the magnetic system carrier structure, providing a hand grip to turn the second part relative to the first part. And in one embodiment the ion source further comprises a motor driven mechanism to provide translation of the second part.

In one embodiment of the invention the RF feedthrough is a physical feedthrough, further comprising a bullet shaped antenna joined to the RF feedthrough, suspended within the cylindrical interior volume of the of the vacuum envelope. Also, in one embodiment the ion source further comprises a magnetically permeable annular disk surrounding the cylindrical portion of the vacuum envelope and abutting the flange, the magnetically permeable annular disk shaping the magnetic field such that a region of the magnet field of strength over a specific strength is wholly constrained within the ion source. Also, in one embodiment the ion source further comprises a filler element that is an electrical insulator and has low RF absorption characteristics within the cylindrical portion of the vacuum envelope, the filler element having a length less than the length of the cylindrical portion of the iris structure. an outer diameter of the inside diameter of the iris structure and an inside diameter of an outside diameter of the bullet shaped antenna, such that the filler element, the bullet shaped antenna and the exit aperture of the iris structure define a limited volume region behind the exit aperture. In one embodiment the filler element is made of one of boron nitride, porcelain, silica, titania, alumina or sapphire. And in one embodiment the RF feedthrough is a window feedthrough.

DETAILED DESCRIPTION OF THE INVENTION

Figure 1A:
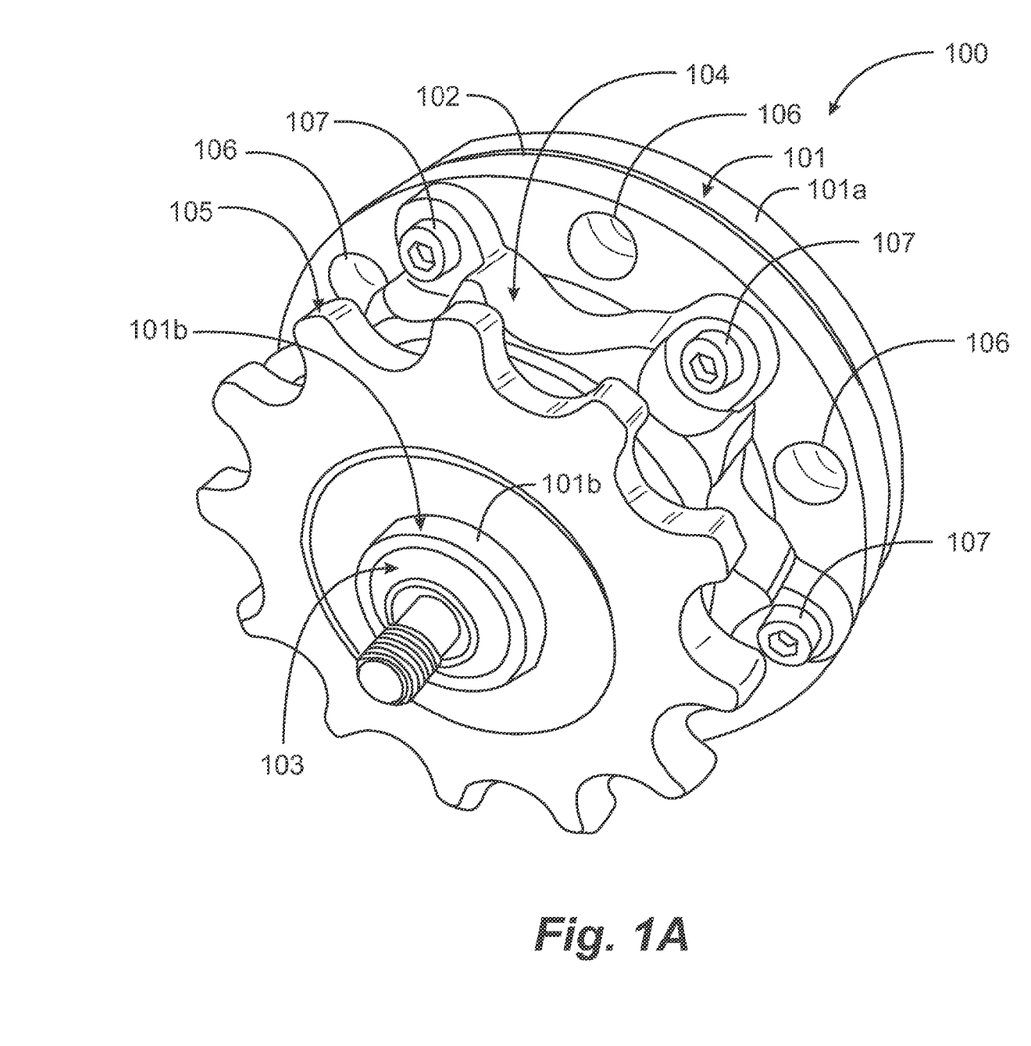
FIG. 1A is a perspective view of a miniature ion source according to an embodiment of the present invention.

FIG. 1A is a perspective view of a miniature ion source 100 according to an embodiment of the present invention. Miniature ion source 100 has a basic machined metal unit 101 which is based on a flange 101a welded or otherwise integrated with a cylinder 101b that forms a vacuum envelope within which a plasma may be struck to provide ions. The material in one embodiment is stainless steel. In some embodiments the cylindrical envelope may be joined to flange 101a, which may be in a Conflat™ configuration, or in some embodiments the entire unit 101 may be machined from a contiguous piece of stainless steel.

Figure 1B:
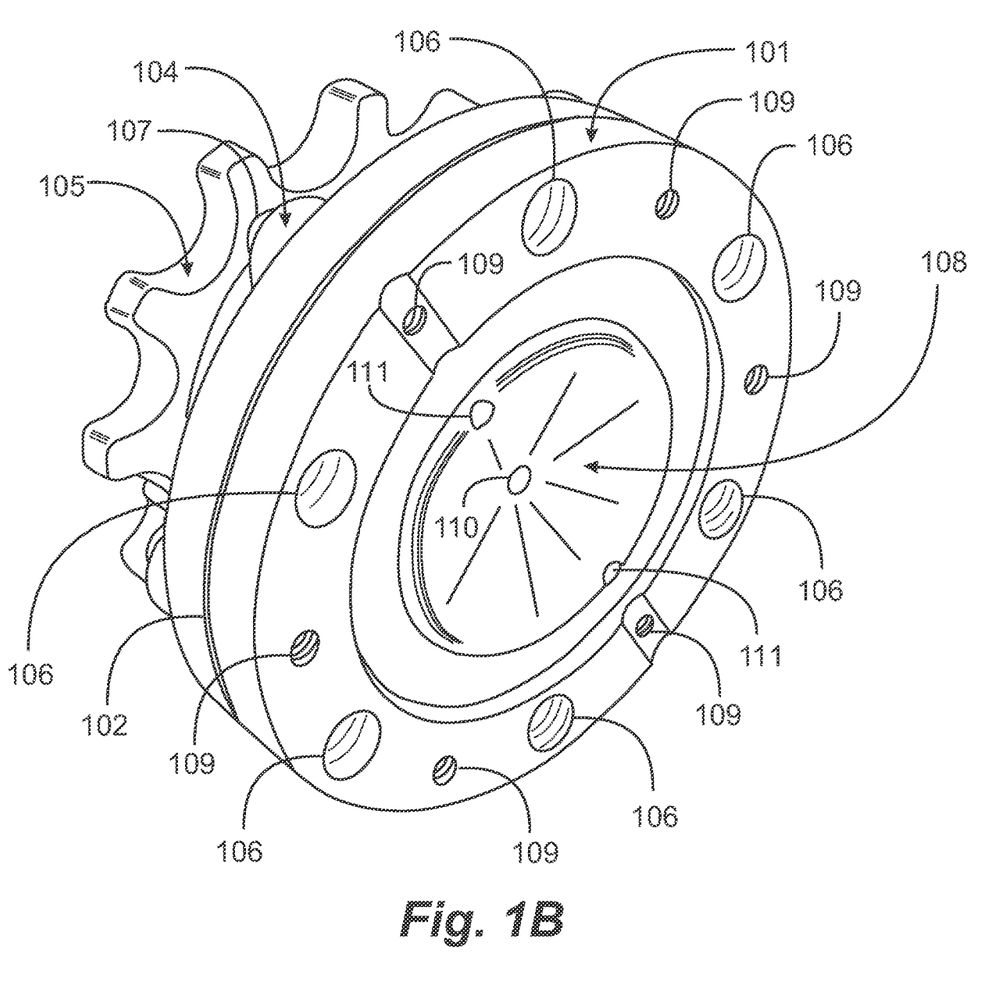
FIG. 1B is a perspective view of the miniature ion source of FIG. 1A from a different viewpoint, showing other elements of the source.

In the embodiment depicted in FIGS. 1A and 1B flange 101a is a Conflat™ DN35CF of 2.75 inches outside diameter. This dimension provides meaningful context as to the overall size of the miniature ion source, which may be seen in FIGS. 1A and 1B to have an overall length in the direction of a central axis somewhat less than the overall diameter of the flange, which is the overall outside diameter of the miniature ion source. Element 102 is circumferential groove around flange 101a, and is common to a Conflat™ flange.

Returning now to FIG. 1A an RF feedthrough 103 is positioned to close an open end of cylinder 101b. With a gas in the vacuum envelope this feedthrough provides power to strike and maintain a plasma within the vacuum envelope, as is illustrated and described elsewhere below in this specification. The gas may be one of several candidate gases, such as hydrogen. In one embodiment the gas used is deuterium, an isotope of hydrogen also called heavy hydrogen. In another embodiment tritium, another isotope of Hydrogen may be used. In one embodiment a mixture of deuterium and tritium may be used.

The plasma generated in the vacuum envelope formed by cylinder 101b is a magnetically enhanced plasma, requiring a structured magnetic field, provided by a set of annular permanent magnets that are arranged to in a stack with spacers around and along the outside diameter of cylinder 101b as is also illustrated and described in enabling detail below. The stack of permanent magnets is carried in an assembly of two non-magnetic structures 104 and 105, which may in one embodiment be plastic. Structure 104 has a female thread in the direction of the axis of the miniature ion source and is bolted to metal unit 101a by conventional fasteners 107, in this example socket head screws. Structure 105 has a male thread that engages the female thread of structure 104, and the two structures together form an enclosure that holds the stack of magnets and spacers. Turning structure 105 clockwise moves the magnet stack forward in the direction of the axis and turning structure 105 counterclockwise moves the magnet stack in the opposite direction along the axis. The structures and operation are described in enabling detail below with reference to additional figures.

FIG. 1B illustrates the miniature ion source in an embodiment of the invention from a viewpoint showing a front face of the miniature ion source, which is the face from which ions are emitted in operation. An iris structure 108 with a concave front face, having a shaft (not shown) with a male thread, engages a female thread internal to cylinder 101b, and provides a removable iris for the miniature ion source. Iris structure 108 has a centrally positioned ion exit aperture 110, which may be a circular opening. The iris structure further has two holes 111 for engaging a turning tool to manipulate the iris structure.

Other parts of the miniature ion source as seen in FIG. 1B are introduced in the description above of FIG. 1A. Female threaded holes 109 are for the fasteners 107 from the opposite side securing plastic magnet carrying structure 104.

Figure 2A:
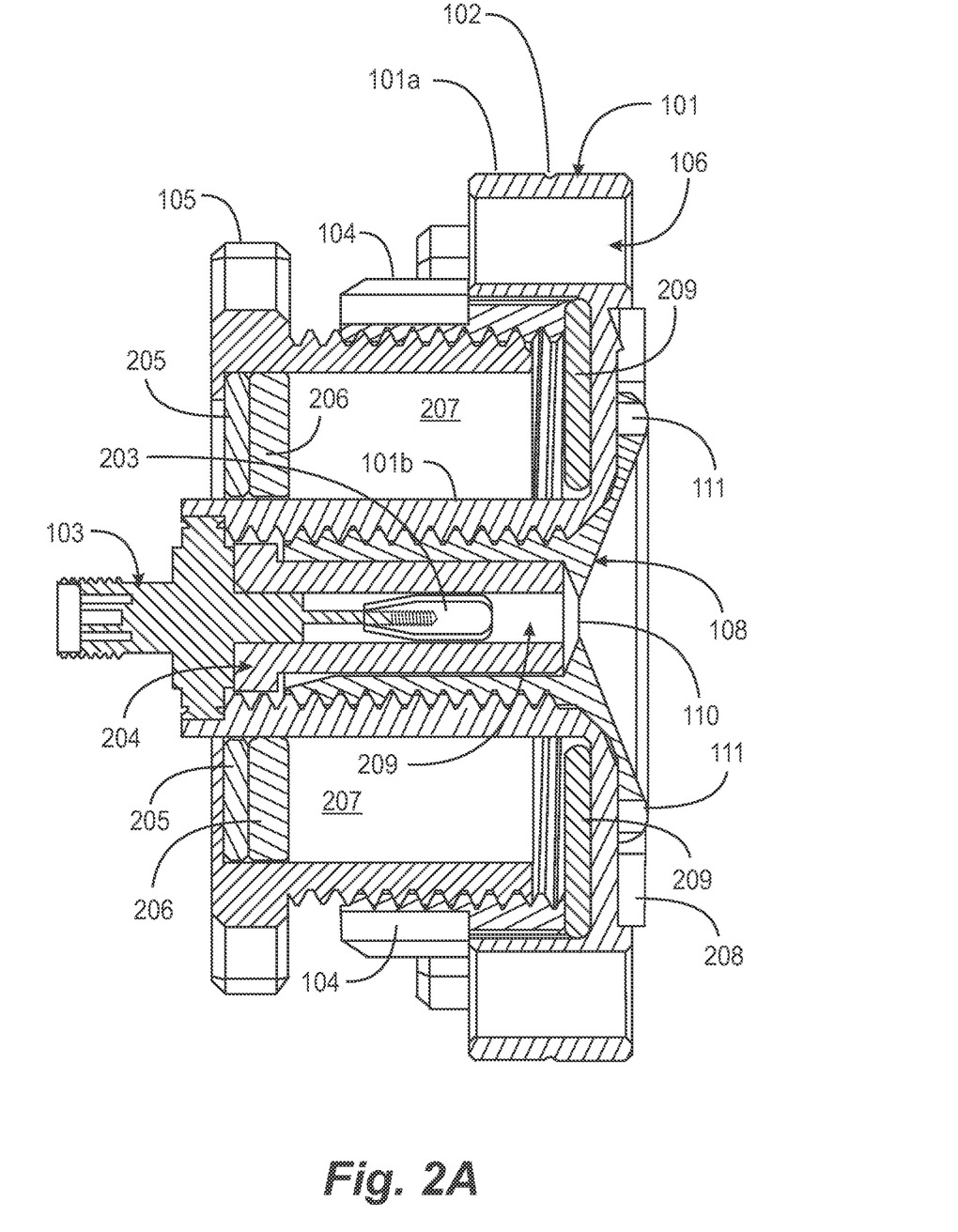
FIG. 2A is an elevation cross-section view of the miniature ion source of FIG. 1A.

FIG. 2A is an elevation cross-section view of miniature ion source 100 of FIGS. 1A and 1B in one embodiment of the invention, the section line bisecting the miniature ion source along the central axis. A basic element of the miniature ion source is a vacuum envelope unit 101 that may be stainless steel, among other candidate materials, which comprises a flange region 101a and a cylindrical region 101b. As described above, flange region 101a may be welded to cylindrical region 101b, or the entire unit may be machined from a contiguous piece of stainless steel. It is seen in the cross section that cylindrical region 101b has a female thread implemented for nearly the full length of the inside diameter.

Plastic structure 104 that is shown as bolted to unit 101 in FIG. 1A is seen in cross section adjacent to unit 101 and has an inside diameter with a female thread in the direction of the axis of the miniature ion source. Structure 105 is seen in section as having a hand wheel on an outside end (best seen in FIG. 1A) and a cylindrical region having a male thread that engages the female thread of plastic structure 104. Structure 104 and 105 together create an internal volume 207 that is in the shape of a hollow cylinder. This is a region in the miniature ion source for holding a stack of magnets and spacers that implement a magnetic field for enhancing the plasma in the source. Permanent magnet 205 and spacer 206 are exemplary elements of the stack of magnets and spacers. The threaded engagement of structure 104 and structure 105 provide a means of moving a stack of magnets incrementally along the axis of the miniature ion source, which allows fine tuning of the magnetic field that enhances the plasma in the source.

In alternative embodiments the engagement between structures 104 and 105 may be implemented as a slip fit engagement and structure 105 may be moved by a belt drive or a cog wheel, for example. Any mechanical means of translation may be implemented, and the translation mechanism may be motor driven and may be under computer control.

A magnetically permeable disk 209, which may be iron, is installed between structure 104 and unit 101 as seen in the cross section view and has a purpose of trimming the magnetic field as is described in more detail below.

Referring back in FIG. 2A to cylindrical region 101*b* of unit 101, which has an inside diameter with a female thread, iris structure 108, also called out in FIG. 1B, comprising a conical outer region and a cylindrical region with a male thread, engages the lengthwise female thread of region 101*b* of unit 101, and implements a cylindrical inner volume that in this particular embodiment is partially filled by a filler element 204. Iris structure 108 has an aperture 110. Filler element 204 has an inside diameter implementing a region in which a bullet shaped antenna 203, connected to RF feedthrough 103 by threaded engagement, is positioned. The bullet shaped antenna has an outer diameter as a slip fit to the inner diameter of filler element 204, and a minimum volume 210, immediately adjacent the exit aperture, is a volume where a plasma may be struck and maintained, just behind aperture 110. Antenna 203 may have rounded edges intended primarily to reduce a tendency for electrical breakdown to occur with high RF Electric fields.

In one embodiment filler element 204 is made of ceramic boron nitride which allows RF energy to pass through unimpeded and reduces volume of the region available to ions. The filler element causes the miniature ion source cavity dimensions to be larger than the miniature ion source plasms/gas volume dimensions. Only ions that exit the miniature ion source exit aperture contribute to an ion source beam current so only forming ions in proximity to the exit aperture contributes to the beam current. Energy ionizing gas that does not subsequently lead to beam current is wasted energy. The filler element seeks to fill those regions with something other than gas to avoid power loss of generating plasma that does not contribute to beam current.

In one implementation the filler element is shaped to entirely isolate gas from the bullet antenna, enclosing the antenna so the antenna is not in direct contact with the ions. In another implementation, the filler element may have a tube so the antenna is in contact with the gas in the miniature ion source, but ions cannot fill regions to the sides of the bullet. In one embodiment the filler element may have a pattern of grooves to increase the path length on the surface. Additionally, the filler element may have a collar behind the bullet antenna which prevents ions forming behind the antenna. The collar may have a concentric pattern of circles to increase the path length on the surface between the antenna feedthrough and the outside of the miniature ion source, to increase lifetime by increasing the resistance of a sputter deposited film on the surface of the filler element.

Boron nitride is known to have a high electron emission rate, when struck by an ion, which aids plasma striking. Boron nitride also has a reduced ability to catalyze recombination of atomic ions to become molecular species.

Figure 2B:
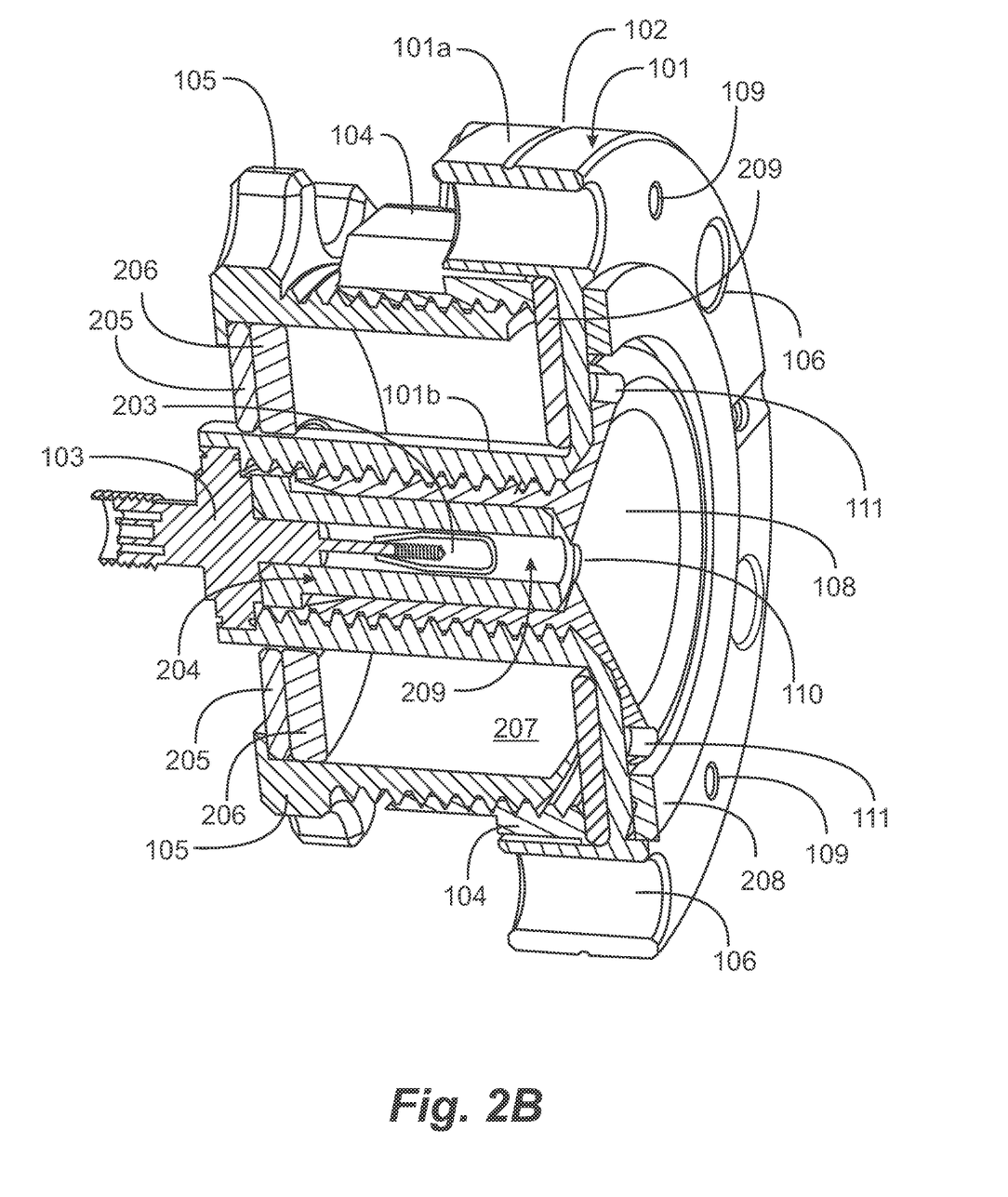
FIG. 2B is a perspective elevation cross-section view of the miniature ion source of FIG. 1A.

FIG. 2B is a perspective elevation cross-section view of the miniature ion source of FIG. 1A provided to illustrate relationships of elements in further detail. All elements retain the element numbers of FIG. 2A. The inventor believes the shape and placement of the iris elements are better seen in FIG. 2B than in FIG. 2A.

Figure 3A:
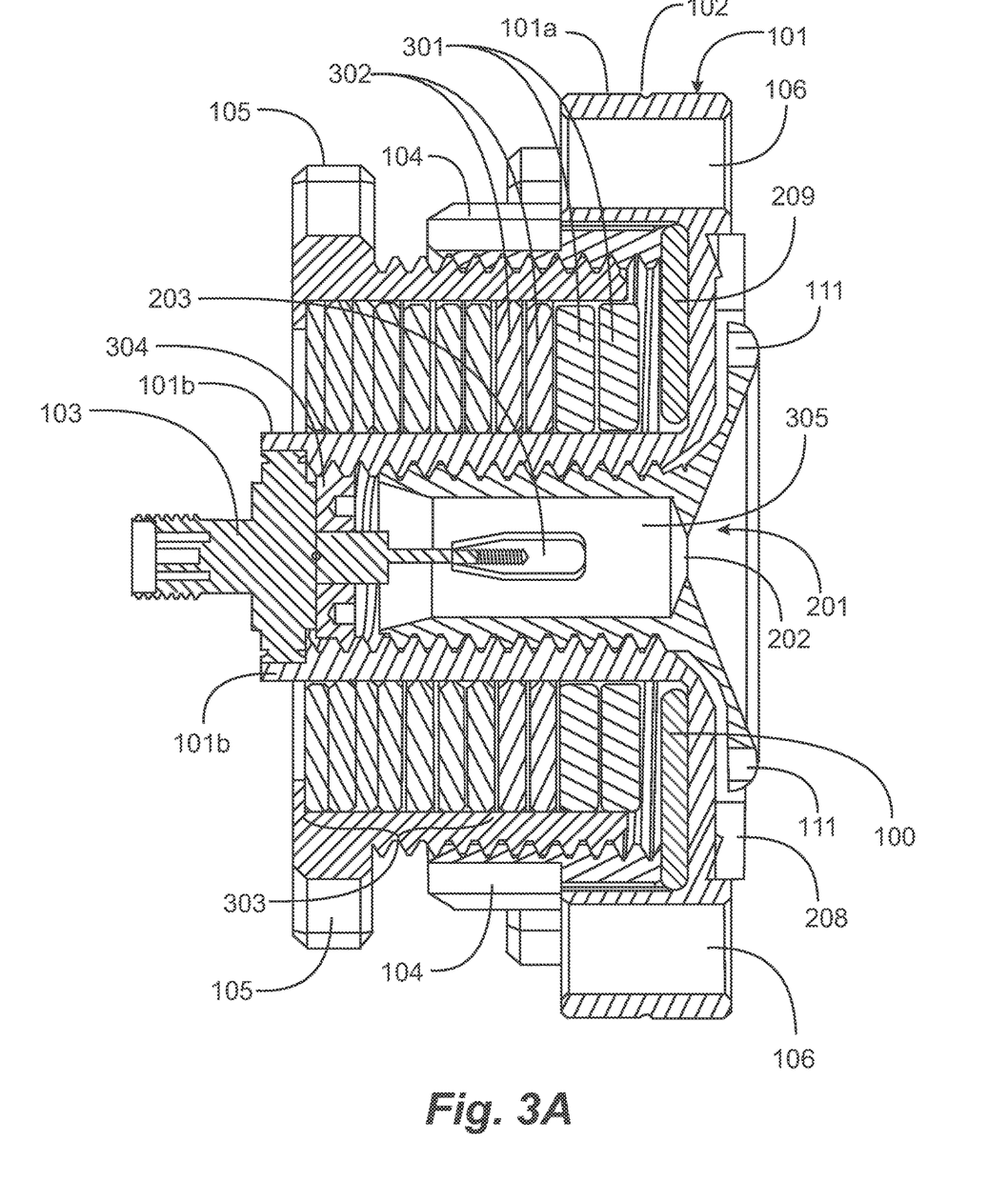
FIG. 3A is an elevation cross-section view of a miniature ion source in an alternative embodiment of the invention.

FIG. 3A is an elevation cross-section view of a miniature ion source in an alternative embodiment of the invention. The source illustrated in FIG. 3A differs from the source illustrated in FIGS. 1A, 1B, 2A and 2B, in that there is no filler element 204, and in that a full complement of permanent magnets and spacers are shown assembled in the source. Instead of the filler element 204 a collar 304 is provided, engaging the internal female threading of cylinder 101*b* and positioned adjacent the inside of RF feedthrough 103. Collar 304 may be of the same material as filler element 204, which may be boron nitride ceramic.

The stack of magnets and spacers is shown to have, in this implementation, two permanent magnet rings 301, two spacer rings 302 of high magnetic permeability, such as soft iron, and a plurality of non-magnetic spacers 303. It may be seen that in this illustration there is a space between magnet disk 301 at the end of the stack and magnetically permeable disk 209. It will be apparent to the skilled person that rotation of plastic structure 105 clockwise moves the stack of magnets and spacers in the direction of the central axis close to magnetically permeable disk 209. Rotation of structure 105 counterclockwise moves the stack further away from magnetically permeable disk 209. The result is movement of the magnetic field created by magnetic disks 301, which effects the plasma density and location in volume 305. A purpose of this variability is to fine tune the plasma for provision of ions.

Figure 3B:
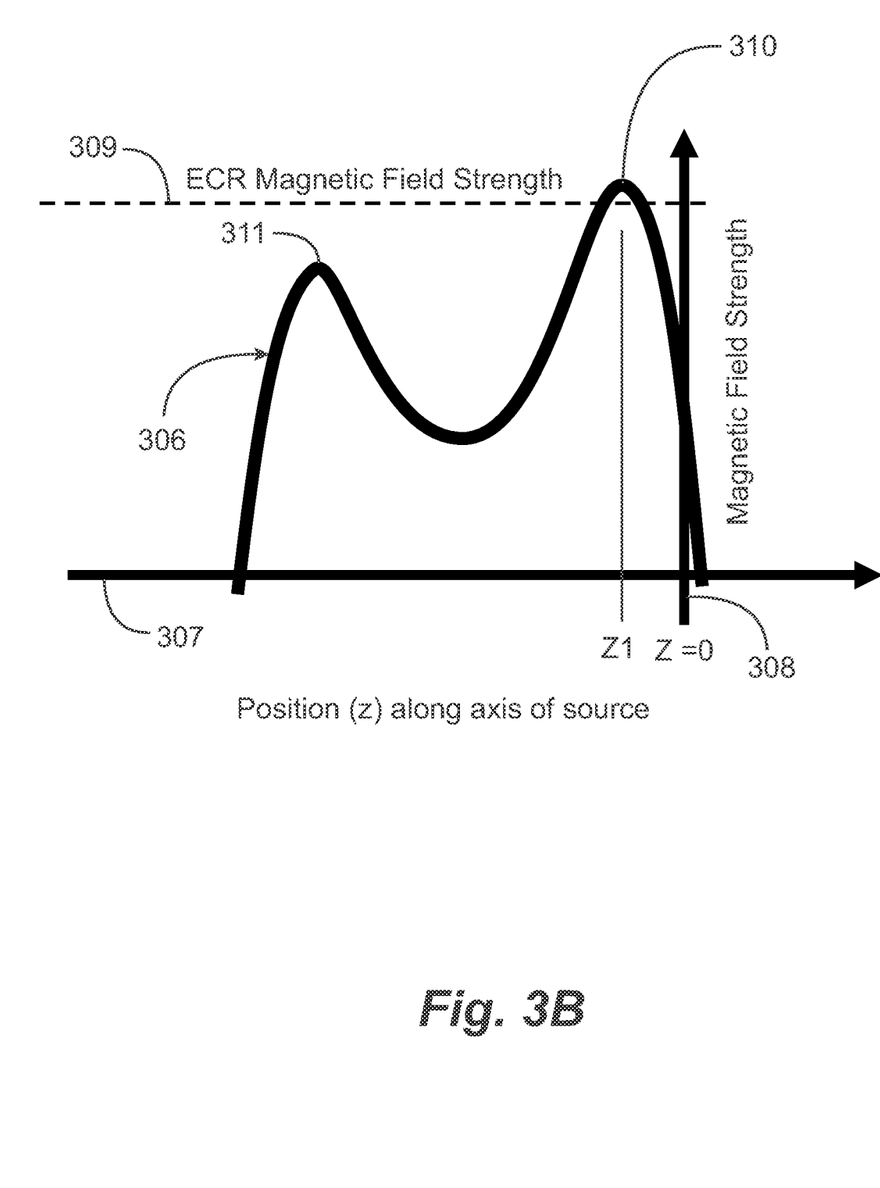
FIG. 3B is a graph of magnetic field strength in relation to position in the miniature ion source of FIG. 3A.

FIG. 3B is a graph of the strength of the magnetic field showing structure of an ideal magnetic field for the miniature ion source in an embodiment of the invention. In FIG. 3B axis 307 coincides with the central axis of the miniature ion source in an embodiment of the invention, and position on axis 307 is axial position in the miniature ion source. Axis 308 is considered Z=0 and is located at the axial position of the ion exit aperture 110. Position Z1 is an axial position in the miniature ion source a short distance inside the position of the ion exit aperture 110.

For the plasma to form at position Z1 the magnetic field strength at this position should be at or a bit above the ECR resonance field strength shown as line 309, this being the field strength at which resonance occurs between the input power frequency and the frequency of electron spin around lines of magnetic force. Curve 306 indicates the ideal field magnitude, which peaks at point 310 a little above the ECR magnetic field strength at position Z1. Ideally field strength elsewhere should be substantially less than this magnitude, although there may be another peak, such as peak 311 further inside the miniature ion source.

Figure 4A:
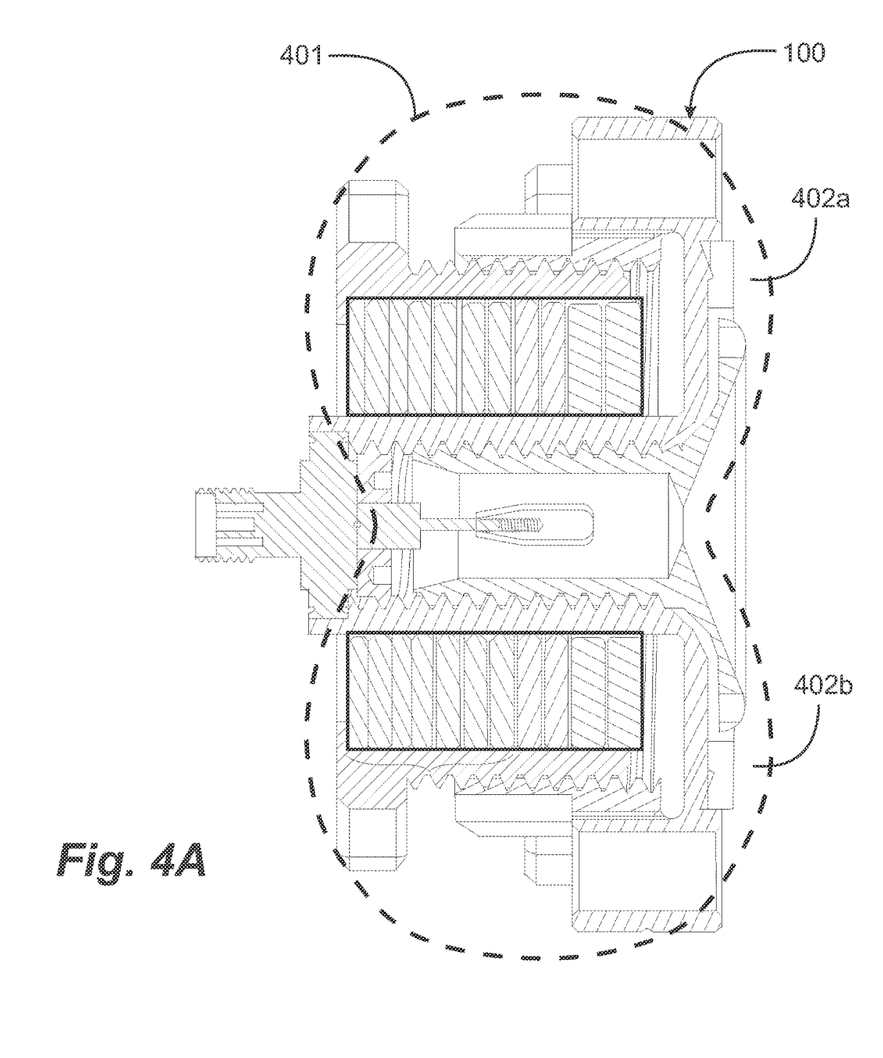
FIG. 4A is a diagrammatic view of a magnetic field in and around a miniature ion source according to an embodiment of the invention.

FIG. 4A is a view of the cross section of the miniature ion source 100 of FIG. 3A in relatively light line weight, with magnetically permeable disks 209 removed, to illustrate an undesirable condition that occurs without the disks 209. Dotted line 401 illustrates a region of relatively high magnetic field strength provided by the magnetic disks in the stack of permanent magnets and spacers held in the plastic structures 104 and 105. Without the magnetically permeable disks 209 the region of high field strength extends beyond the position of the exit aperture 110, as seen by regions 402*a* and 402*b*.

ECR Ion sources according to embodiments of this invention are meant for applications providing ions for such as lithography and for ion accelerators for bombarding targets for various purposes. The miniature ion source of the instant invention is particularly suited for portable equipment such as systems producing neutrons for radiography for building inspection, for example. In most applications of the miniature ion source of the invention the region outside the exit aperture where ions are provided is under a substantial electric field to accelerate the ions. Such high electric field strength coupled with a substantial magnetic field strength may cause serious problems.

Figure 4B:
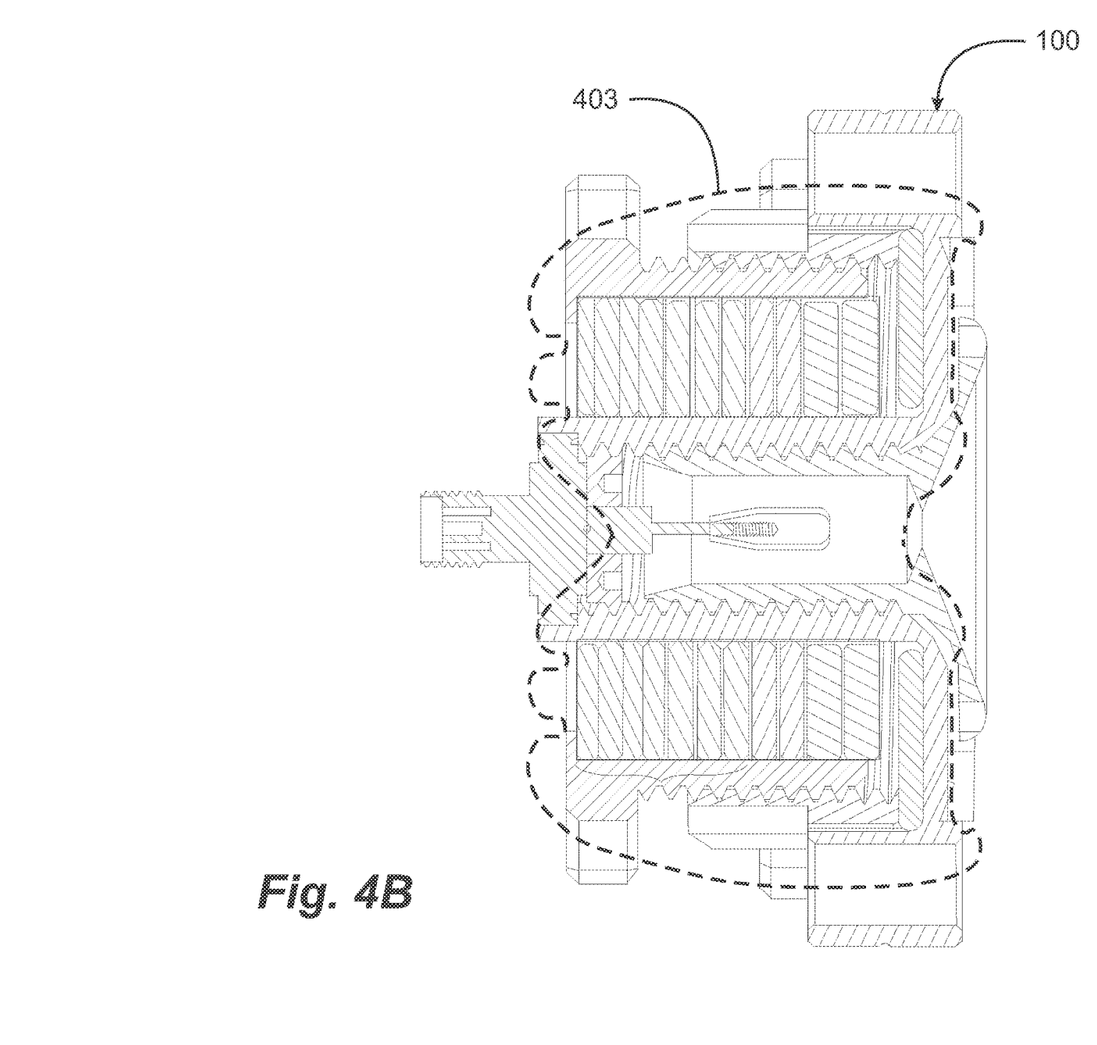
FIG. 4B is a diagrammatic view of a magnetic field altered by an additional element in and around a miniature ion source, according to an embodiment of the invention.

FIG. 4B is a view of the cross section of the miniature ion source 100 of FIG. 3A in relatively light line weight, with magnetically permeable disks 209 in place. It may be seen that in this circumstance regions 403a and 402b no longer exist, as there is no penetration of the high magnetic field strength beyond the exit aperture. With magnetically permeable disks 209 in place, and with aid of other such permeable disks such as disks 302, as seen in FIG. 3A, the region of high magnetic field strength is confined within the outer envelope of the miniature ion source. Different configurations of the magnetic field may be managed by placement of magnetically permeable disks.

An ECR ion source optimally operates at a frequency determined by the magnetic field (or conversely the magnetic field is set to the desired operating frequency). This frequency is given by the Electron Cylotron Resonance condition, $2\pi f = eB/m$ where f is the ECR frequency, e/m is the charge-to-mass ratio of the electron, the accepted value being 175882001000 Coulombs per kg, and B is the applied magnetic field. Table 1 below gives the required magnetic field at some common RF frequencies.

TABLE 1

Some example ECR frequencies v. Field strength

| Frequency (GHz) | Magnetic field (Gauss) |
|---|---|
| 2.45 | 875 |
| 5 | 1,786 |
| 10 | 3,572 |
| 14 | 5,001 |
| 16 | 5,716 |

The miniature ion source in one embodiment of the invention is implemented for 10 GHz operation in order that the dimensions of the chamber appropriately scaled to the wavelength of the RF waves used to produce the plasma. Operating at lower frequencies is expected to allow only fractions of one wavelength to fit within the miniature ion source volume. Despite a large RF wavelength compared to the miniature ion source size, the miniature ion source in one embodiment may operate at 2.45 GHz, for which the magnetic field strength for resonance is 875 Gauss, and can operate at higher frequencies, however the range is limited by the frequency range of the RF feedthrough.

The very small plasma volume of the miniature ion source in embodiments of the invention is key to achieving low power operation since the volume of gas that is ionized is minimized.

In one embodiment magnets 301, high magnetic permeability sheets 209 and 302, spacers 303 and holders 104 and 105 may be fabricated as a single unit, which might additionally contain cooling channels to promote air or liquid flow, although since the power requirement of these miniature ion sources is so low, this may be of limited benefit. When implemented as integrated with a modified DN35CF flange as shown and described, the miniature ion source unit is small and becomes a replaceable unit. Miniature ion sources according to embodiments of the present invention have many over prior art sources, including:

1. Low power operation resulting from a small plasma volume. For a given RF power density a smaller volume results in a need for a lower power.
2. Small size and weight. For comparison the plasma volume of one implementation of the source in an embodiment of the invention is about 200 mm³ compared to typical ECR ion sources cited in the prior art that have volumes between 56,500 mm³ and 450,000 mm³.
3. Vacuum compatibility. In one embodiment the miniature on source is constructed from Ultra High Vacuum (UHV) compatible components that can be baked, which is a step commonly employed when making a sealed chamber system.
4. Magnets of sources in embodiments of the invention can be removed for baking.
5. Frequency of operation can be varied without dismantling the miniature ion source, and without breaking vacuum: A different microwave source (and RF matching elements) can be attached to the feedthrough and an appropriate magnet set installed, which has ideally been previously engineered to operate at the desired frequency with the field.
6. The vacuum envelope and iris are separate, and the iris may be replaced. This may enable effective maintenance and reduced repair costs if an iris become worn during operation.
7. The iris assembly is replaceable. During testing a range of irises may be tested with a range of iris diameters, and the best operation for a given application may be chosen.
8. The miniature ion source is mechanically extremely rugged—there is a cantilevered antenna, but this is of low mass, and of short length, and in the implementation with an insulating tube the antenna bullet is separated from the miniature ion source wall by the insulating tube, so is constrained in motion radially, so will not flex, leading to an extremely rugged mechanical design.

A person with ordinary skill in the art will understand that the embodiments illustrated and described in this application are exemplary only, and do not limit the scope of the invention, which is limited only by the claims below.

The invention claimed is:

1. An ion source, comprising:
   a vacuum envelope structure comprising a cylindrical portion with a lengthwise axis and an inside diameter defining an interior volume, joined at one end to a flange concentric with the axis, the cylindrical portion open by an exit aperture through the flange and open at an end opposite the flange;
   an RF feedthrough closing the open end of the cylindrical portion opposite the flange, creating a cylindrical interior volume open only through the exit aperture; and
   a magnet system carrier structure surrounding the cylindrical portion of the vacuum envelope and carrying at least one annular permanent magnet concentric with the lengthwise axis, providing a magnetic field penetrating the interior volume;
   characterized in that the magnet system carrier structure is translatable along the lengthwise axis enabling variable positioning of the magnetic field in the interior volume along the lengthwise axis.

2. The ion source of claim 1 wherein the structure of the magnet system is implemented to provide a magnetic field strength at the axis, adjacent the exit aperture within the volume of the vacuum envelope, of a strength to provide electron cyclotron resonance (ECR) with frequency of power provided at the RF feedthrough.

3. The ion source of claim 1 wherein the cylindrical portion of the vacuum envelope is open through the flange at the inside diameter, further comprising an iris structure having a front face joined to a cylindrical portion with an inside diameter, and an outside diameter sized to fit within the inside diameter of the cylindrical portion of the vacuum envelope, the iris structure providing the exit aperture through the front face, the iris structure inserted into the cylindrical portion of the vacuum envelope such that the front face of the iris structure is proximate the flange.

4. The ion source of claim 3 further comprising female threading on the inside diameter of the of the cylindrical portion of the vacuum envelope and male threading on the outside diameter of the cylindrical portion of the iris structure, such that the iris structure is threaded into the vacuum envelope until a back part of the front face of the iris structure is proximate the flange.

5. The ion source of claim 3 wherein a front part of the front face of the iris structure presents a convex conical shape concentric with the lengthwise axis.

6. The ion source of claim 1 wherein the magnet system carrier structure has a first portion fastened to the flange of the vacuum envelope with internal threading in the direction of the axis, and a second portion that carries the at least one annular permanent magnet, the second portion having external threading, such that engaging the threads and turning the second portion relative to the first portion provides the translation of the second portion and the magnetic field along the axis.

7. The ion source of claim 1 wherein the magnet system carrier structure carries a stack of one or more annular permanent magnets and spacers.

8. The ion source of claim 7 wherein the spacers are one of magnetically permeable material or non-magnetic material.

9. The ion source of claim 1 wherein the magnet system carrier structure is made from a non-magnetic material.

10. The ion source of claim 8 wherein the carrier structure is made from a polymer material.

11. The ion source of claim 1 further comprising an annular magnetically permeable disk surrounding the cylindrical portion of the vacuum envelope adjacent the flange, the magnetically permeable disk shaping the magnetic field such that magnetic field strength beyond the flange away from the ion source is kept substantially below the ECR field strength.

12. The ion source of claim 1 wherein the material of the vacuum envelope is stainless steel.

13. The ion source of claim 1 wherein the flange conforms to dimensions and characteristics of a Conflat™ DN35CF of 2.75 inches outside diameter, such that the overall diameter of the ion source is 2.75 inches.

14. The ion source of claim 6 further comprising a hand wheel joined to the second part of the magnetic system carrier structure, providing a hand grip to turn the second part relative to the first part.

15. The ion source of claim 14 further comprising a motor driven mechanism to provide translation of the second part.

16. The ion source of claim 1 wherein the RF feedthrough is a physical feedthrough, further comprising a bullet shaped antenna joined to the RF feedthrough, suspended within the cylindrical interior volume of the of the vacuum envelope.

17. The ion source of claim 1 further comprising a magnetically permeable annular disk surrounding the cylindrical portion of the vacuum envelope and abutting the flange, the magnetically permeable annular disk shaping the magnetic field such that a region of the magnet field of strength over a specific strength is wholly constrained within the ion source.

18. The ion source of claim 3 further comprising a filler element that is an electrical insulator and has low RF absorption characteristics within the cylindrical portion of the vacuum envelope, the filler element having a length less than the length of the cylindrical portion of the iris structure, an outer diameter of the inside diameter of the iris structure and an inside diameter of an outside diameter of the bullet shaped antenna, such that the filler element, the bullet shaped antenna and the exit aperture of the iris structure define a limited volume region behind the exit aperture.

19. The ion source of claim 17 wherein the filler element is made of one of boron nitride, porcelain, silica, titania, alumina or sapphire.

20. The ion source of claim 1 wherein the RF feedthrough is a window feedthrough.

* * * * *